United States Patent
Schmid et al.

(10) Patent No.: US 9,076,931 B2
(45) Date of Patent: Jul. 7, 2015

(54) OPTOELECTRONIC COMPONENT AND METHOD FOR PRODUCING SAME

(75) Inventors: Wolfgang Schmid, Regensburg (DE); Christoph Klemp, Regensburg (DE); Alvaro Gomez-Iglesias, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 150 days.

(21) Appl. No.: 13/878,178

(22) PCT Filed: Oct. 17, 2011

(86) PCT No.: PCT/EP2011/068133
§ 371 (c)(1), (2), (4) Date: Jun. 14, 2013

(87) PCT Pub. No.: WO2012/052415
PCT Pub. Date: Apr. 26, 2012

(65) Prior Publication Data
US 2013/0264596 A1  Oct. 10, 2013

(30) Foreign Application Priority Data
Oct. 21, 2010  (DE) .................. 10 2010 049 186

(51) Int. Cl.
| | |
|---|---|
| H01L 31/0264 | (2006.01) |
| H01L 33/46 | (2010.01) |
| H01L 33/44 | (2010.01) |
| H01L 33/40 | (2010.01) |

(52) U.S. Cl.
CPC ....... *H01L 33/46* (2013.01); *H01L 2924/10345* (2013.01); *H01L 2924/10342* (2013.01); *H01L 2924/10349* (2013.01); *H01L 33/44* (2013.01); *H01L 2924/10339* (2013.01); *H01L 2924/10336* (2013.01); *H01L 33/405* (2013.01); *H01L 2924/0002* (2013.01)

(58) Field of Classification Search
CPC ....... H01L 33/405; H01L 33/44; H01L 33/46; H01L 2924/10336; H01L 2924/10339; H01L 2924/10342; H01L 2924/10345; H01L 2924/10349
See application file for complete search history.

(56) References Cited

U.S. PATENT DOCUMENTS

| | | | |
|---|---|---|---|
| 2003/0020084 A1* | 1/2003 | Fan et al. | 257/92 |
| 2005/0211993 A1* | 9/2005 | Sano et al. | 257/79 |
| 2008/0237620 A1* | 10/2008 | Shiue et al. | 257/98 |
| 2010/0065867 A1* | 3/2010 | Unno | 257/98 |

FOREIGN PATENT DOCUMENTS

| | | |
|---|---|---|
| DE | 10 2004 061 865 A1 | 3/2006 |
| DE | 10 2007 029 370 A1 | 11/2008 |
| DE | 10 2008 035 900 A1 | 11/2009 |
| WO | 2010/150114 A2 | 12/2010 |

* cited by examiner

*Primary Examiner* — Fei Fei Yeung Lopez
(74) *Attorney, Agent, or Firm* — Slater & Matsil, L.L.P.

(57) ABSTRACT

An optoelectronic component has a semiconductor body, a dielectric layer, a mirror and an additional layer. The semiconductor body has an active zone for generating electromagnetic radiation and an n-contact and a p-contact (1*b*) for electrical contacting purposes. The dielectric layer is disposed between the semiconductor body and the mirror. The additional layer is disposed between the semiconductor body and the dielectric layer. Furthermore, a method for producing a component of this type is provided.

19 Claims, 10 Drawing Sheets

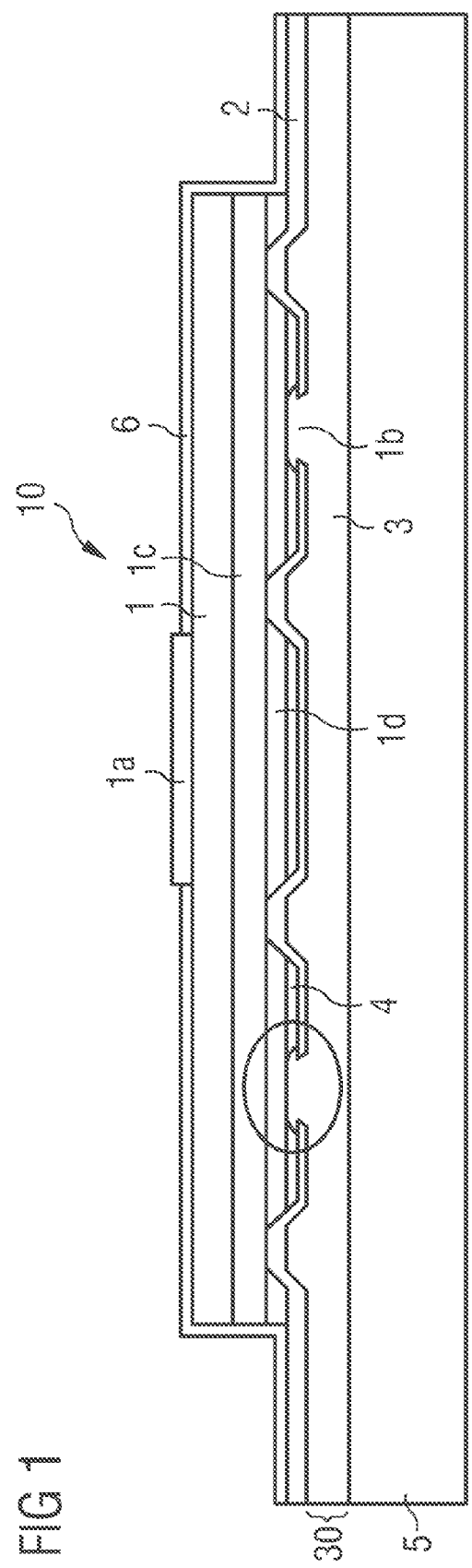

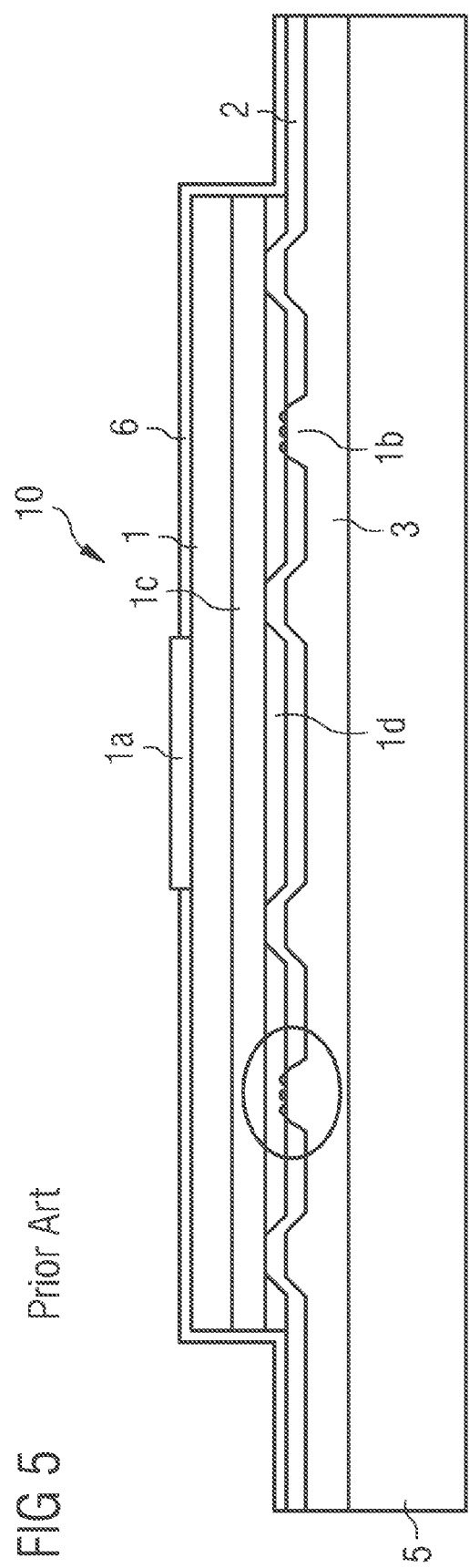

FIG 6   Prior Art
A
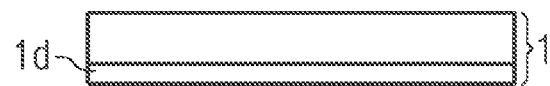
B
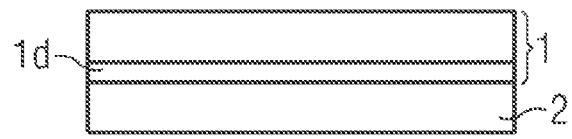
C
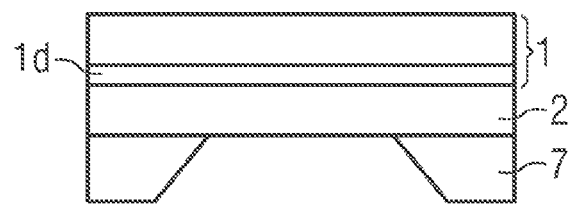
D
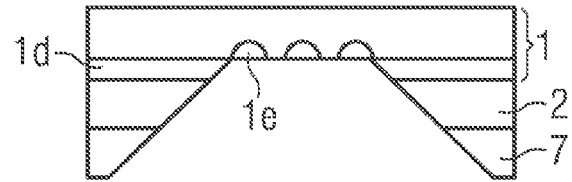
E
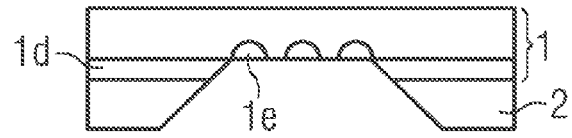
F
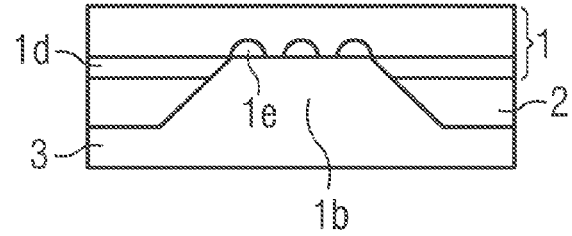

FIG 8  Prior Art
A
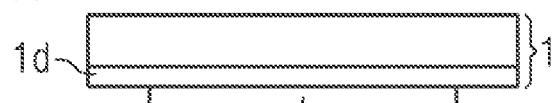
B
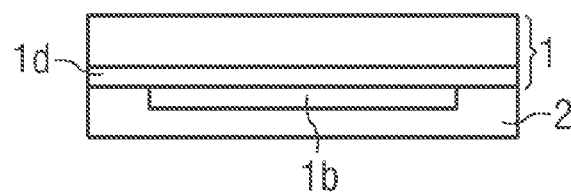
C
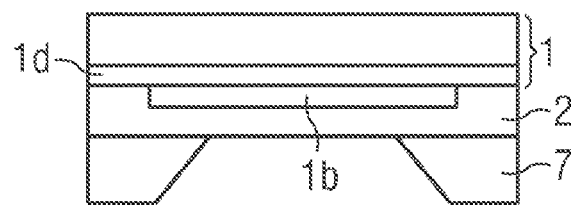
D
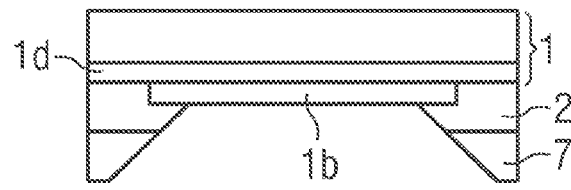
E
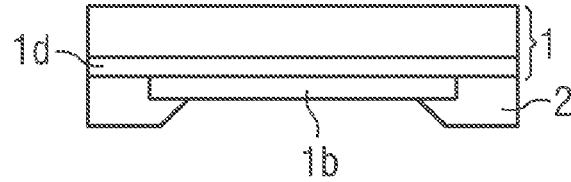
F
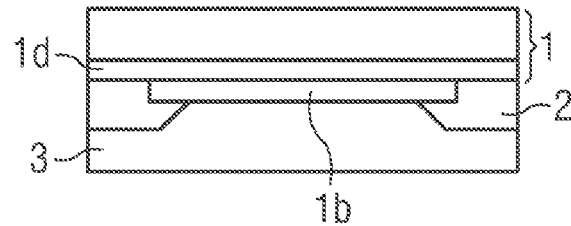

OPTOELECTRONIC COMPONENT AND METHOD FOR PRODUCING SAME

This patent application is a national phase filing under section 371 of PCT/EP2011/068133, filed Oct. 17, 2011, which claims the priority of German patent application 10 2010 049 186.1, filed Oct. 21, 2010, each of which is incorporated herein by reference in its entirety.

TECHNICAL FIELD

The invention relates to an optoelectronic semiconductor component having a semiconductor body and a mirror. Furthermore the invention relates to a method for producing a semiconductor component of this type.

BACKGROUND

In conventional optoelectronic components, which are, in particular, formed as thin-film components, the light produced in the components is dispersed in a thin semiconductor body until it is coupled-out as desired or is absorbed in an undesired manner. Since, owing to the high refractive index of semiconductors, there is an extremely low likelihood of coupling-out for each impingement on a coupling-out surface, the light passes lengthwise in the semiconductor body, whereby the likelihood of absorption is increased. The efficiency of such components is dependent, in particular, upon the degree of absorption of the radiation in the semiconductor body.

Such semiconductor components have, amongst other things, a carrier on which the semiconductor body is mounted. A mirror is disposed between the semiconductor body and carrier in order that no light enters the carrier, where it is absorbed. However, such mirrors have a reflectivity of less than 100%, which means that upon impingement of light on the mirror some percentage of the light is absorbed. In order to increase the reflectivity in conventional components, for example, a layer of SiN is disposed between the mirror and the semiconductor body, this layer having a low refractive index and only low absorption properties. A high proportion of the light is subject to total reflection at the boundary surface between the semiconductor body and the SiN layer and therefore does not reach the mirror, whereby only the portion of the light which is not subject to total reflection undergoes reflection at the mirror and partial absorption.

Since the SiN layer is formed in an electrically insulating manner, it is opened at points so that a flow of current into the semiconductor body is made possible. During these processes of opening the SiN layer, however, the semiconductor body lying thereunder can disadvantageously be disrupted in areas. The electrical contact connection to the semiconductor body is thereby rendered more difficult. Furthermore the semiconductor body which has been disrupted in areas has no protective function for the semiconductor layers lying thereunder, which means that these can be disadvantageously attacked by different subsequent process steps.

For example, in the case of a InGaAlP thin film semiconductor body, an AlGaAs layer is used for current distribution over the active zone and is protected by a GaAs layer. The GaAs layer is formed very thinly in order to achieve low absorption properties. If the GaAs layer is disrupted during the production process, the AlGaAs layer lying thereunder is exposed to chemicals during the production process, wherein this AlGaAs layer can be attacked and thus can disadvantageously impair the function of the component.

SUMMARY OF THE INVENTION

Embodiments of the invention provide an optoelectronic component while avoiding these disadvantages, this component having reduced absorption properties and thus providing increased efficiency. Other embodiments of the invention provide an optoelectronic component that is characterized by simplified production and lower production costs.

In accordance with the invention an optoelectronic semiconductor component is provided which has a semiconductor body, a dielectric layer, a mirror and an additional layer. The semiconductor body has an active zone for generating electromagnetic radiation. In addition the semiconductor body has an n-contact and a p-contact for electrical contacting purposes. The dielectric layer is disposed between the semiconductor body and the mirror. The additional layer is disposed between the semiconductor body and the dielectric layer.

An optoelectronic component is, in particular, a component which makes it possible to convert electronically generated energy into a radiation emission or vice versa. For example, the optoelectronic component is a radiation-emitting component.

In particular, in comparison to conventional components, a further layer, the additional layer, is disposed between the semiconductor body and the dielectric layer. This is characterized by low absorption properties. During the production process, in particular during the opening processes applied therein, the additional layer protects the semiconductor body in such a way that this body is not disrupted or is hardly disrupted to any perceptible degree. The thickness of the additional layer is such that sufficient protection of the semiconductor body can be guaranteed. In addition the additional layer is of such a structure that it can be opened with respect to the semiconductor body with a high level of selectivity.

In comparison to conventional components without such an additional layer, in the semiconductor component in accordance with the invention, a smaller p-contact can advantageously be used, whereby lower absorption in the p-contact can be achieved. In addition a p-contact can advantageously be formed with reflective properties and good connection properties without causing disruption to the semiconductor body.

The additional layer preferably has a high level of moisture-tightness. This minimizes the risk of moisture being able to reach into the semiconductor body thereunder and reacting therein during operation.

The material of the additional layer is preferably selected such that the quantization energy in the p-contact of the electron states and hole states can be increased, whereby a further reduction in the absorption is advantageously made possible. In particular, a fundamental absorption can thus be virtually or completely avoided.

In a development a further additional layer is disposed between the semiconductor body and n-contact. The advantages of such an additional layer can thus also be achieved on the n-side of the semiconductor component.

The semiconductor body has an attachment side with which the semiconductor body is disposed, for example, on a carrier. On the side opposite to the attachment side, the semiconductor body has a radiation outlet side from which the majority of the radiation emitted from the semiconductor body exits. The semiconductor body is, for example, a surface-emitting semiconductor body.

The active zone of the semiconductor body preferably has a pn-transition, a double heterostructure, a single quantum well (SQW) or a multi-quantum well (MQW) for radiation generation. No significance in terms of the dimensionality of the quantization should be derived from the designation 'quantum well structure.' It therefore includes, amongst others, quantum wells, quantum wires and quantum dots and each combination of these structures.

The semiconductor body, in particular the active zone, contains at least one III/V semiconductor material, such as a material of the material systems $In_xGa_yAl_{1-x-y}P$, $In_xGa_yAl_{1-x-y}N$ or $In_xGa_yAl_{1-x-y}As$, in each case with $0<x$, $y<1$ and $x+y<1$. III/V semiconductor materials are particularly suitable for radiation generation in the ultraviolet ($In_xGa_yAl_{1-x-y}N$), through the visible ($In_xGa_yAl_{1-x-y}N$, in particular for blue to green radiation, or $In_xGa_yAl_{1-x-y}P$, in particular for yellow to red radiation) to the infrared ($In_xGa_yAl_{1-x-y}As$) spectral range.

The semiconductor body can be electrically contacted by means of the p-contact and of the n-contact. For example, the semiconductor body is attached to the carrier by means of an electrically conductive adhesive, for example, a conductive adhesive or an electrically conductive solder. The second electrical contacting of the semiconductor body can be made possible by means of a bond wire which is guided from the n-contact of the semiconductor body to a conductive track of the carrier.

The additional layer preferably comprises InGaAlP or InAlP as the material, wherein the aluminum content is selected such that no fundamental absorption occurs at the emission wavelength of the radiation emitted from the active zone. Alternatively the additional layer can have GaP or low-indium InGaAlP. In addition a dielectric, for example, ZnO, can be used as the material for the additional layer. A dielectric additional layer such as this advantageously has a low refractive index.

The dielectric layer preferably comprises SiN, SiO or SiON.

The p-contact preferably comprises a metal, for example, Au or Ag. Alternatively the p-contact can also comprise a conductive dielectric, for example, ZnO, ITO or a combination of these materials.

The minor preferably comprises Au or Ag.

The additional layer can be formed in an electrically conductive manner. In particular, the additional layer can contain an electrically conductive material. Since the additional layer, however, does not necessarily have to comprise electrical properties, the material of the additional layer can also have electrically insulating properties.

The semiconductor body is preferably an LED. The semiconductor body is preferably a thin-film LED. Within the scope of the application an LED is regarded as a thin-film LED, during production whereof the growth substrate on which a semiconductor layer sequence of the semiconductor body was grown—for example, epitaxially—has been released.

In a development the p-contact is formed in a structured manner. The p-contact therefore does not extend over the whole base surface of the semiconductor body but is disposed only in regions of the semiconductor body.

In a development the p-contact and the mirror are formed as one piece. In this case the p-contact and the mirror are made from the same material and are applied together during the production process. Consequently no boundary surface is formed between the p-contact and the minor. The p-contact and the minor completely merge into each other.

Alternatively the mirror and the p-contact are formed in two parts. In this case the minor and the p-contact can comprise different material. In particular, a boundary surface is formed between the minor and the p-contact. In this case the materials of the minor and of the p-contact can be selected independently of each other according to the properties required.

In a development the dielectric layer has an aperture in the region of the p-contact. If the p-contact is formed in a structured manner, the dielectric layer can accordingly have a plurality of apertures which approximately coincide with the structure of the p-contact. In particular, electrical contacting of the semiconductor body through the aperture or through the plurality of apertures can be made possible.

In a development the additional layer has an aperture in the region of the p-contact. If the p-contact is formed in a structured manner the additional layer can also have a plurality of apertures in respective regions of the structured p-contact. The dielectric layer and the additional layer in this case have apertures, wherein the apertures in the additional layer are disposed directly over the apertures in the dielectric layer. Thus electrical contacting of the semiconductor body can be made possible.

In a development a minor layer is disposed between the minor and the dielectric layer and has an aperture or apertures in the region of the p-contact. In this case the dielectric layer, the additional layer and the mirror layer therefore have apertures which are disposed respectively one above the other, in particular in equivalent regions. The mirror layer preferably comprises a metal or a metal alloy or consists thereof. In addition the mirror layer can have a layer made from an optically low-refractive-index material, such as silicon oxide or silicon nitride, on a side of the metal layer facing the semiconductor body.

In a development the p-contact or the minor is guided through the apertures in the dielectric layer, the additional layer and/or the mirror layer. Since the p-contact and the minor are formed from an electrically conductive material, direct electrical contact to the semiconductor body can thus be made possible. This electrical contact is guided through the apertures in the different layers.

In a development the dielectric layer and the additional layer are formed from mutually different materials. In particular the dielectric layer and the additional layer consist of materials from different classes of material. For example, the dielectric layer is a silicon-containing layer. The additional layer can consist of a semiconductor material such as $In_xGa_yAl_{1-x-y}P$, $In_xGa_yAl_{1-x-y}N$ or $In_xGa_yAl_{1-x-y}As$, in each case with $0<x$, $y<1$ and $x+y<1$. The semiconductor material can be different from a material of the semiconductor body. In particular the additional layer is formed from a metal oxide such as ZnO. The dielectric layer can be formed from a metal oxide or semiconductor oxide or metal nitride or semiconductor nitride different therefrom.

In a method for producing an optoelectronic component with a semiconductor body, a dielectric layer, a mirror and an additional layer the following method steps are used:

providing the semiconductor body which has an active zone and an n-contact, applying the additional layer to the side of the semiconductor body facing away from the n-contact, forming apertures in the additional layer, applying the dielectric layer to the additional layer, forming apertures in the dielectric layer in the region of the apertures in the additional layer, applying a structured p-contact to the semiconductor body in the apertures in the dielectric layer and in the additional layer, applying the mirror to the dielectric layer and the p-contact.

Advantageous developments of the method are achieved analogously to the advantageous developments of the component and vice versa.

In an advantageous manner by means of the method in accordance with the invention a reflective p-contact with good connection properties is formed after formation of the apertures in the dielectric layer so that the semiconductor body is not disrupted and thus, in an advantageous manner, no disruptions are caused in the semiconductor material. The structuring of the individual layers is advantageously carried out by a photoresist. The structuring of the individual layers can preferably be carried out with the same photoresist. The structure of the apertures in the dielectric layer thus defines the structure of the p-contact. Such a method makes possible a combination of a simplified production process with the advantage of a satisfactorily reflecting p-contact.

In addition, in an advantageous manner different materials can be selected for the minor and p-contact since the material of the minor can be applied and structured before the apertures are formed in the dielectric layer. In this case the structuring can be applied with the same photoresist and consequently the same resist structure as the photoresist for forming the apertures in the dielectric layer.

A further advantage is characterized in that, in comparison to conventionally produced components, fewer process steps are required owing to the repeated use of a photoresist, whereby the semiconductor body is subjected to fewer process steps. The semiconductor layer adjoining the semiconductor body on the p-side can thus be selected to be thinner, whereby reduced absorption can advantageously be achieved.

In addition the individual layers, in particular the additional layer, and possibly further layers such as the dielectric layer or the minor can be applied directly to the semiconductor body after epitaxial deposition thereof, whereby, directly after production thereof, the semiconductor body is protected by the applied layers, which is advantageous, in particular, if it is necessary to store the components.

In a development the additional layer and the dielectric layer are applied first and then the apertures are formed in the additional layer and the dielectric layer. In this case, the apertures in the dielectric layer and in the additional layer are consequently formed together in a common method step so that, in an advantageous manner, only one photoresist is required to form the apertures.

In a development the p-contact and the mirror are formed as one piece and applied together. In this case the mirror and the p-contact comprise the same material and are applied in a common method step, which means that the number of method steps is reduced in comparison to the conventional method step.

In a development, prior to applying the mirror and the p-contact, a minor layer is applied to the dielectric layer and apertures are formed in the region of the apertures in the additional layer and in the dielectric layer. In this case a plurality of partially reflecting layers, including the additional layer, the dielectric layer, the minor layer and the minor, are consequently disposed on one side of the semiconductor body so that the degree of absorption on this side of the semiconductor body is reduced, whereby the efficiency of the component is advantageously increased.

In a development the structured p-contact is applied prior to application of the dielectric layer to the semiconductor body in the apertures in the additional layer. The further layers, i.e., the dielectric layer, the mirror layer and/or the mirror, are then applied.

BRIEF DESCRIPTION OF THE DRAWINGS

Further features, advantages, developments and expediencies of the component and its method will become clear from the exemplified embodiments illustrated hereinunder in conjunction with FIGS. 1 to 8 in which:

FIG. 1 shows a schematic cross-sectional view of an exemplified embodiment of a component in accordance with the invention;

FIGS. 2A to 2F, 3A to 3I and 4A to 4J each show schematic cross-sectional views of an exemplified embodiment of a component in accordance with the invention in the production method;

FIGS. 5 and 7 each show a schematic cross-sectional view of an exemplified embodiment of a conventional component; and FIGS. 6A to 6F and 8A to 8F each show schematic cross-sectional views of exemplified embodiments of a conventional component in the production method.

Identical parts or parts acting in an identical manner are each provided with the same reference numerals. The illustrated parts and the size ratios of the parts with respect to each other are not to be regarded as being to scale.

DETAILED DESCRIPTION OF ILLUSTRATIVE EMBODIMENTS

Figure 2A:
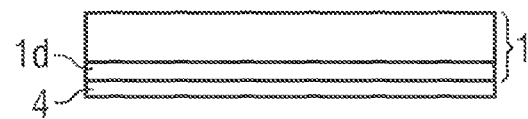

FIG. 5 shows a cross-sectional view of an exemplified embodiment of a conventional component. The component 10 has a semiconductor body 1 which contains an active zone 1c. The active zone 1c is suitable for generating electromagnetic radiation during operation. The semiconductor body 1 further has a radiation outlet side from which, during operation, the majority of the radiation generated in the active zone is coupled-out of the semiconductor body 1. On the side opposite to the radiation outlet side the semiconductor body 1 has an attachment side by which the semiconductor body 1 is applied, for example, on a carrier 5. On the side of the semiconductor body 1 facing the carrier 5 a GaAs connection layer 1d is disposed which terminates the semiconductor body 1 with respect to the carrier.

On regions of the radiation outlet side an n-contact 1a is disposed which serves for electrical contacting of the semiconductor body 1. The semiconductor body 1 is further surrounded by a passivation layer 6 which protects the semiconductor body 1 against environmental influences such as, for example, moisture or mechanical influences.

A mirror 3 is disposed between the carrier 5 and the semiconductor body 1. A dielectric layer 2 is disposed on the mirror 3. Regions of the dielectric layer 2 have openings into which a p-contact is introduced. The p-contact is therefore formed in a structured manner.

In the process of producing the openings in the dielectric layer in order to prepare an electrical contact of the semiconductor body, however, the semiconductor body, in particular the semiconductor layers lying thereunder, can disadvantageously be disrupted. A semiconductor body disrupted in this way causes an electrical contact connection to the semiconductor body to be rendered more difficult and the reduced ability to protect the semiconductor body in the region of the openings. The layers of the semiconductor body can thereby be damaged during the production process, whereby the function and, in particular, the efficiency of the component can be disadvantageously reduced.

FIGS. 6A to 6F show production steps of a conventional component such as shown, for example, in the exemplified embodiment of FIG. 5. FIG. 6A shows the semiconductor body 1, in particular the GaAs termination layer 1d with respect to the carrier side. In method step 6B a dielectric layer 2 is deposited on the GaAs termination layer, wherein a photoresist 7 with apertures in regions is then applied to this dielectric layer 2, as shown in FIG. 6C. The dielectric layer 2 is then opened in regions by means of the photoresist 7. In particular, an aperture is formed in the dielectric layer 2 as shown in FIG. 6D. During opening of the dielectric layer by means of the photoresist 7, however, the semiconductor body 1 can disadvantageously be damaged, wherein disrupted points 1e are produced. Such disrupted points 1e can disadvantageously lead to damage to the layers of the semiconductor body during the remainder of the production process, whereby the function and efficiency of the component are reduced. In method step 6E the photoresist is then removed. In the subsequent method step 6F the p-contact 1b and the minor 3 are applied to the dielectric layer 2 and the semiconductor body 1.

Figure 7:
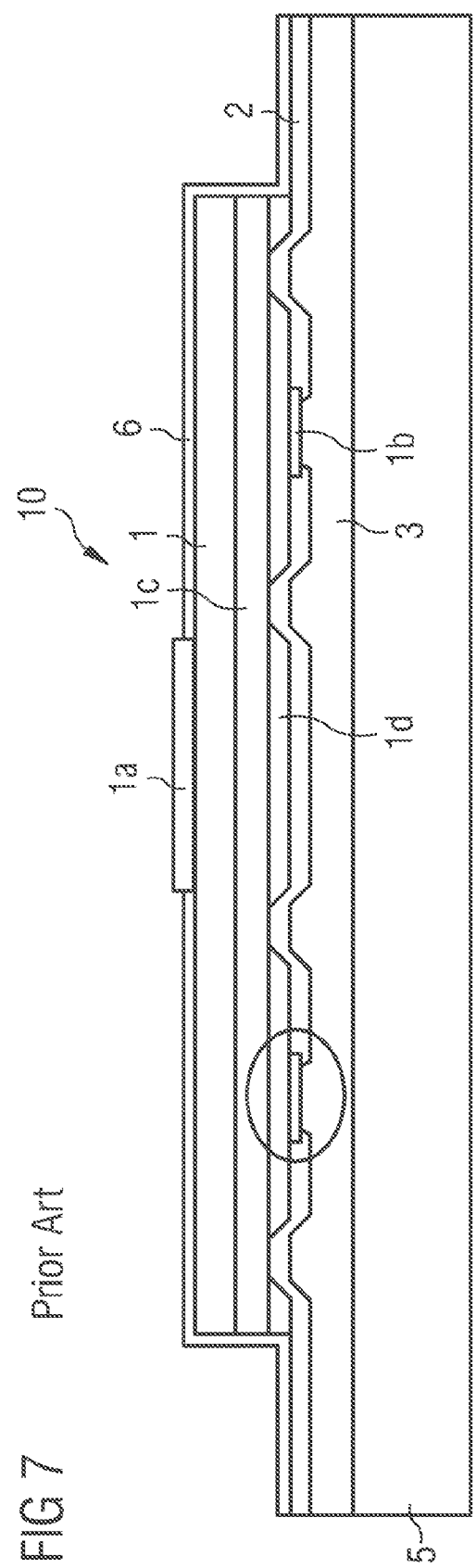

FIG. 7 shows a further exemplified embodiment of a conventional component. In contrast to the exemplified embodiment of the component of FIG. 5 the p-contact 1b and the minor 3 are not formed as one piece. In particular, the p-contact 1b is formed as an extra layer to the minor 3. As a result, the same materials do not necessarily have to be used for the mirror 3 and p-contact 1b, which means that the materials of the minor 3 and of the p-contact 1b can be adapted to required properties of the respective layer.

FIGS. 8A to 8F show method steps for producing a conventional component of the exemplified embodiment of FIG. 7. In FIG. 8A a p-contact 1b is applied to the semiconductor body 1. This p-contact is applied in a structured manner, for which purpose a photoresist is used (not shown). In FIG. 8B the dielectric layer 2 is then deposited on the p-contact 1b and the semiconductor body 1. This dielectric layer 2 is then opened over the p-contact 1b by means of a further photoresist 7. In particular, an aperture in the dielectric layer 2 is formed over the p-contact 1b as shown in FIGS. 8C and 8D. Since the p-contact 1b is already disposed between the aperture in the dielectric layer 2 and the semiconductor body 1, the semiconductor body 1 can advantageously be protected against damage and disruption. The layers of the semiconductor body 1 lying thereunder can also be protected. A disadvantage with the method, however, is that two separate photo techniques are required in order to structure the p-contact 1b and the dielectric layer 2 so that the production process is disadvantageously rendered more difficult and the production costs increase. In addition, the two photo techniques cannot be adjusted with respect to each other at will, which means that the size of the p-contact 1b is limited to a minimum size. In addition, the GaAs termination layer 1d of the semiconductor body 1 must be selected such that this termination layer sufficiently withstands the large number of method steps usually applied in order to provide a sufficiently secure protection function for the layers thereunder. By reason of the long-wave absorption edge and the low band edge of the GaAs termination layer 1d, however, much of the radiation generated by the active zone 1c is absorbed in this layer, which disadvantageously reduces the efficiency of the component.

The photoresist is removed as shown in FIG. 8E subsequent to the formation of the aperture in the dielectric layer 2. The mirror 3 can then be applied to the dielectric layer 2 and the p-contact 1b as shown in FIG. 8F.

FIG. 1 shows an exemplified embodiment of a component in accordance with the invention. The semiconductor component 10 has a semiconductor body 1 which contains an active zone 1c. The active zone is suitable, in particular, to generate electromagnetic radiation in operation. For example, the semiconductor body 1 is an LED. The semiconductor body 1 is preferably a thin-film LED. The semiconductor body 1 is preferably based on a nitride compound semiconductor, a phosphide compound semiconductor or an arsenide compound semiconductor.

The semiconductor body 1 is disposed on a carrier 5. The layer of the semiconductor body 1 facing the carrier 5 is a GaAs termination layer 1d.

The semiconductor body 1 has a radiation outlet side from which the majority of the radiation of the semiconductor body 1 generated during operation exits. On the radiation outlet side an n-contact 1a is disposed in regions which serves for electrical contacting of the semiconductor body 1. In particular, by means of a bond wire, electrical contacting of the n-contact 1a can be guided to an electrical conductive track of the carrier 5 (not shown).

The semiconductor body 1 is surrounded by a passivation layer 6 to provide protection against environmental influences. The passivation layer 6 protects, in particular, the semiconductor body 1 against, for example, moisture and mechanical environmental influences.

A dielectric layer 2 is disposed between the carrier 5 and the semiconductor body 1. Between the dielectric layer 2 and the carrier 5 a minor 3 is disposed which reflects radiation generated in the active zone in the direction of the radiation outlet side so that the radiation efficiency of the component is advantageously increased. An additional layer 4 is disposed between the semiconductor body 1 and the dielectric layer 2.

Regions of the additional layer 4 and the dielectric layer 2 have an aperture. In particular, the additional layer 4 and the dielectric layer 2 each have an aperture in a p-contact region 1b of the semiconductor body 1.

The p-contact 1b of the semiconductor body 1 is structured. In particular, the p-contact 1b is formed only on regions of the semiconductor body 1.

In the exemplified embodiment of FIG. 1 the p-contact 1b and the mirror 3 are formed as one piece as layer 30. In this case the material of the mirror 3 and of the p-contact 1b is consequently identical. No boundary surface is formed between the mirror 3 and p-contact 1b.

By reason of the apertures in the dielectric layer 2 and the additional layer 4, electrical contacting of the semiconductor body 1 can be made possible by means of the p-contact 1b and of the mirror 3. In particular, the carrier 5 can be formed in an electrically conductive manner which means that electrical contacting of the semiconductor body 1 takes place via the carrier 5, the mirror 3 and the p-contact 1b. On the other side, the electrical contacting takes place via the n-contact 1a and a bond wire.

The material of the additional layer is, for example, InGaAlP or InAlP. The aluminum content is selected in such a way that no fundamental absorption occurs at the emission wavelength of the semiconductor body 1. Alternatively the material of the additional layer 4 may have no electrical function, which means that GaP or low-In InGaAlP can be used as the material of the additional layer. Alternatively the materials of the additional layer 4 can be dielectrics such as, for example, ZnO, which are characterized in particular by their low refractive index. Since the additional layer 4 does not necessarily have to serve for current distribution in the semiconductor body 1, the additional layer 4 can contain undoped ZnO.

The dielectric layer 2 comprises, for example, SiN, SiO or SiON as a material.

The material for the p-contact can be, for example, Au, Ag or conductive dielectrics such as, for example, ZnO, ITO or combinations of these materials.

By reason of the additional layer 4 the quantization energy advantageously increases, whereby the absorption edge of the p-contact is increased. The absorption in the component is thereby advantageously reduced so that the radiation efficiency is advantageously further increased.

FIGS. 2A to 2F show method steps for producing a component in accordance with the invention, such as shown, for example, in the exemplified embodiment of FIG. 1. In FIG. 2A the additional layer 4 is applied to the semiconductor body 1, in particular to the GaAs termination layer 1d of the semiconductor body 1. The material of the additional layer 4 is selected in such a way in terms of thickness and composition that it sufficiently protects the semiconductor body 1, in particular the GaAs termination layer, during a subsequent opening process. In addition, the material of the additional layer 4 is selected in such a way that it can be structured with higher selectivity with respect to the semiconductor body 1. The application of the additional layer 4 is preferably effected in the same epitaxial process as the production of the semiconductor body 1.

Figure 2B:
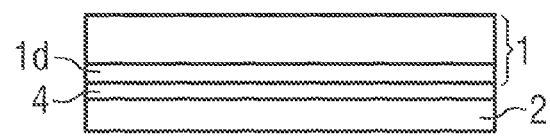
Figure 2C:
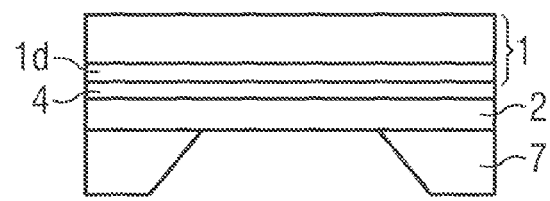

In a subsequent method step as shown in FIG. 2B the dielectric layer 2 is deposited on the additional layer 4. Then, as shown in FIG. 2C, a photoresist 7 is applied to the dielectric layer 4, wherein the photoresist 7 has an aperture.

Figure 2D:
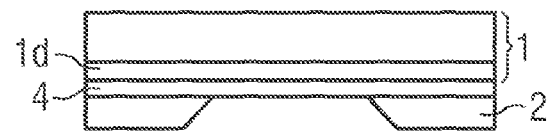

By means of the photoresist 7 the dielectric layer 2 is then structured, in particular, opened. During the structuring process of the dielectric layer 2 the semiconductor body 1, in particular the GaAs termination layer 1d, is protected by means of the additional layer 2. In this way, damage and disrupted points in the GaAs termination layer 1d are advantageously avoided. The photoresist layer 7 is subsequently removed as shown in FIG. 2D.

Figure 2E:
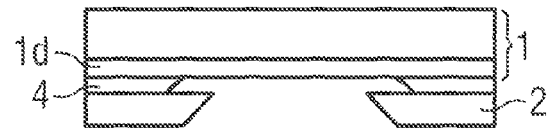

The structured dielectric layer 2 advantageously serves as a mask to open the additional layer 4. In particular, the additional layer 4 is opened in the region of the aperture in the dielectric layer 2, which means that the GaAs termination layer 1d of the semiconductor body 1 is exposed as shown in FIG. 2E. It is possible for the dielectric layer 2 to be undercut during opening of the additional layer 4. In other words, the dielectric layer 2 can protrude over the additional layer 4 in the lateral direction.

Figure 2F:
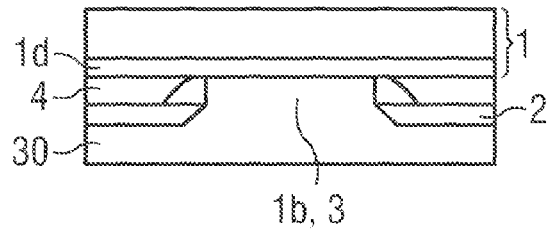

Then, as shown in FIG. 2F, the p-contact 1b is formed in the aperture in the dielectric layer 2 and in the additional layer 4. In particular, within the openings in the dielectric layer 2 and the additional layer 4, a current supply to the semiconductor body 1 can be made possible. In the present exemplified embodiment, in which the p-contact 1b and the mirror are formed as one piece as layer 30, the mirror is formed at the same time in the method step of FIG. 2F. This serves essentially to increase the reflectivity in the direction of the radiation outlet side so that the radiation efficiency of the component is advantageously increased. The minor in the present exemplified embodiment therefore has Au, Ag or a conductive dielectric such as, for example, ZnO, ITO or a combination of these materials as its material.

FIGS. 3A to 3I show production method steps of a further exemplified embodiment of a component in accordance with the invention. In contrast to the exemplified embodiment illustrated in FIG. 1 a component produced in this manner has a further mirror layer 8 formed between the layer 30, which forms the minor 3 and the p-contact 1b, and dielectric layer 2. By means of the additional mirror layer 8 the reflectivity in the component in the direction of the radiation outlet side can be further increased, so that the degree of absorption in the component is reduced, whereby the radiation efficiency is advantageously further increased.

Figure 3A:
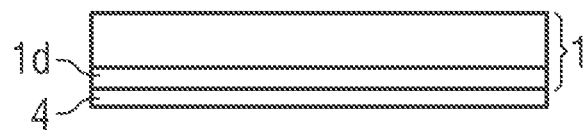
Figure 3B:
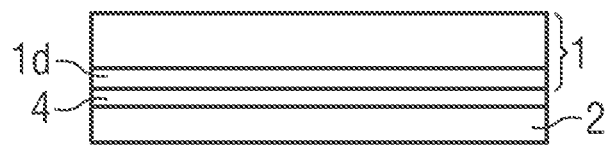
Figure 3C:
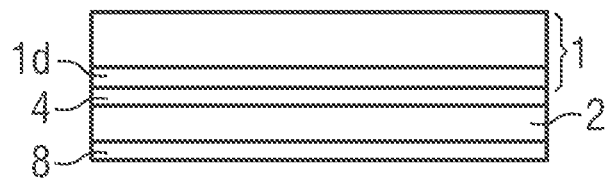
Figure 3D:
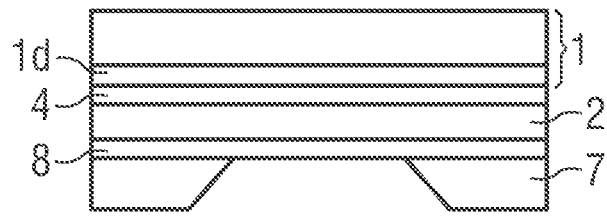

In FIG. 3A an additional layer 4 is applied to the semiconductor body 1 corresponding to the exemplified embodiment of FIG. 2A. Then in method step 3b, corresponding to method step 2b, a dielectric layer 2 is deposited on the additional layer 4.

Method step 3C is an additional step in comparison to the production method of FIGS. 2A to 2F. In method step 3C the minor layer 8 is applied over the whole surface of the dielectric layer 2. The photoresist 7 is then applied to the minor layer 8 (FIG. 3D), wherein the photoresist 7 has an aperture corresponding to the photoresist used in the production method of FIG. 2.

Figure 3E:
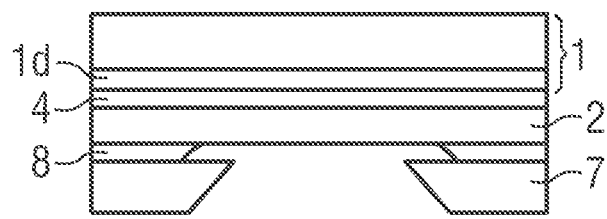
Figure 3F:
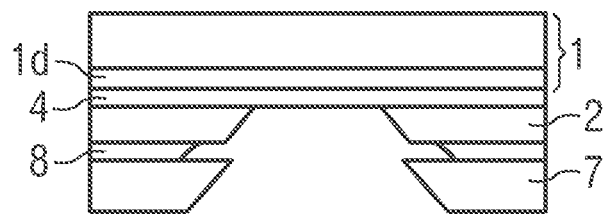

In FIG. 3E the mirror layer 8 is then opened in the region of the aperture in the photoresist 7 so that the mirror layer 8 has an aperture in this region. Then in method step 3F the dielectric layer 2 is opened corresponding to the method step of the exemplified embodiment in FIG. 2D. The mirror layer 8 and the dielectric layer 2 therefore have an aperture in the same region. The photoresist 7 can be used to form the apertures in the dielectric layer 2 and the minor layer 8, which means that only a single photoresist 7 is used for this purpose.

Figure 3G:
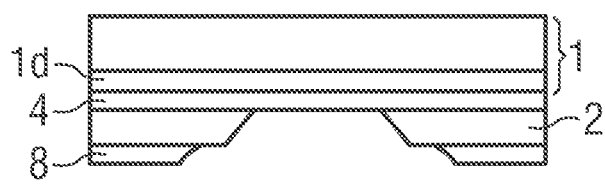
Figure 3H:
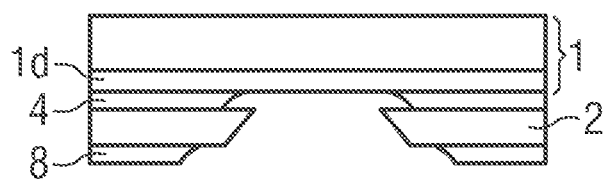

In FIG. 3G the photoresist 7 is then removed. Then, as shown in FIG. 3H, the additional layer 4 is opened in the region of the apertures in the dielectric layer 2 and the minor layer 8. The dielectric layer 4 thus serves as a mask to the opening of the additional layer 4. In this way the GaAs termination layer 1d is stripped of material in regions, which means that electrical contacting of the semiconductor body 1 through the apertures in the mirror layer 8, the dielectric layer 2 and the additional layer 4 is made possible.

Figure 3I:
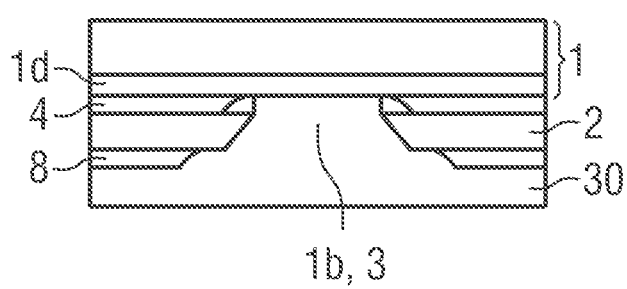

As shown in FIG. 3I, the p-contact 1b is then formed in the apertures in the mirror layer 8, the dielectric layer 2 and the additional layer 4. The mirror is formed in the same method step. In particular, the p-contact 1b and the minor are applied as a common layer 30 in one method step, wherein in the exemplified embodiment of FIG. 3 the mirror and the p-contact 1b are formed as one piece.

The minor layer 8 preferably has a minor material with good reflectivity such as, for example, Au or Ag as its material.

For the remainder, the exemplified embodiment of FIG. 3 corresponds to the exemplified embodiment of FIG. 2.

Figure 4A:
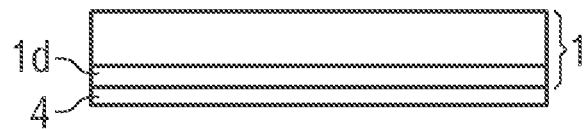
Figure 4B:
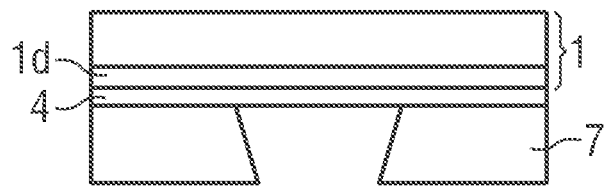
Figure 4C:
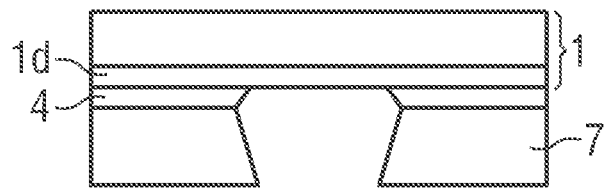

FIGS. 4A to 4I illustrate method steps of an exemplified embodiment of a further semiconductor component. The method step 4A corresponds to the method step 2A in which the additional layer 4 is applied to the semiconductor body 1, in particular the GaAs termination layer 1d. In method step 4B a photoresist 7 is then applied to the additional layer 4 which has an aperture. Then, as shown in FIG. 4C the additional layer 4 is opened in regions by means of the photoresist 7. Thus, the GaAs termination layer 1d of the semiconductor body 1 can be formed free of the material of the additional layer 4.

Figure 4D:
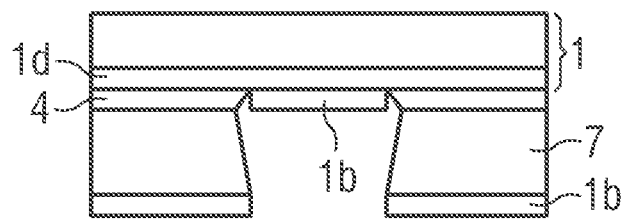

Then, as shown in FIG. 4D, the p-contact 1b is applied. The p-contact 1b is deposited on the photoresist 7 and in the aperture in the GaAs termination layer 1d of the semiconductor body 1. The p-contact 1b is therefore disposed in the aperture in the additional layer 4, wherein the p-contact is in direct contact with the GaAs termination layer 1d of the semiconductor body 1.

Figure 4E:
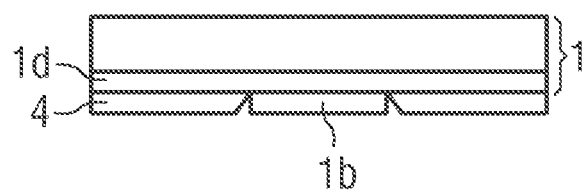
Figure 4F:
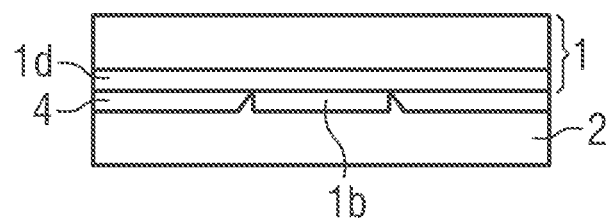
Figure 4G:
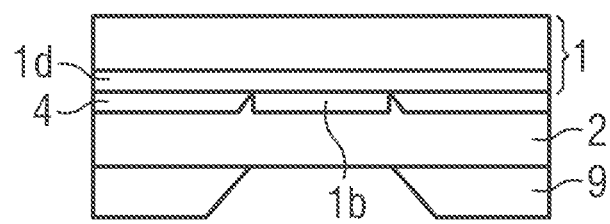
Figure 4H:
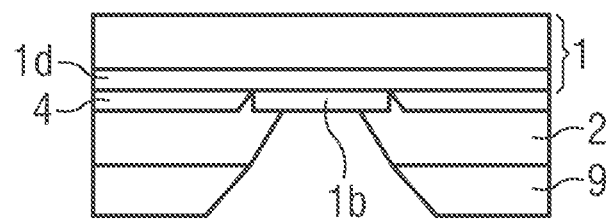

Then, as shown in FIG. 4E, the photoresist and the p-contact disposed thereon are lifted off. As shown in FIG. 4F, the dielectric layer 2 is then applied to the additional layer 4 and to the p-contact 1b disposed in the aperture in the additional layer 4. Regions of this dielectric layer 2 are then opened by means of a further photoresist 9 as shown in FIGS. 4G and 4H. In particular, the dielectric layer 2 is opened in the region of the p-contact 1b. Regions of the dielectric layer 2 therefore have an aperture in the region of the p-contact 1b. Thus electrical contacting of the semiconductor body through the aperture in the dielectric layer 2 can take place via the p-contact 1b. In particular, after opening of the dielectric layer 2, the p-contact 1b is free of material of the dielectric layer 2.

Figure 4I:
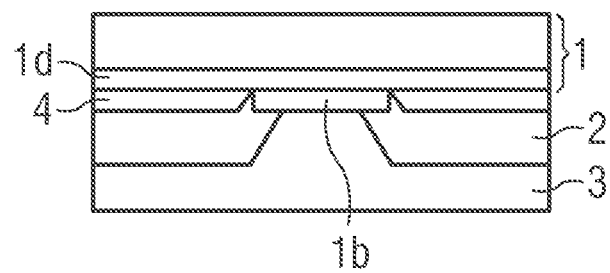

As shown in FIG. 4I the minor 3 is then applied directly to the dielectric layer 2 and the p-contact 1b. The material of the mirror 3 is applied into the aperture in the dielectric layer 2 and to the dielectric layer 2. The electrical contacting of the semiconductor body 1 can thus take place via the mirror 3 and the p-contact 1b.

The component in accordance with the invention, which is produced by means of a production method according to method steps 4A to 4I, advantageously comprises different materials for the p-contact 1b and the minor 3, which means that the respective materials can be adapted to the desired specifications of the respective layer.

The invention is not limited by the description with the aid of the exemplified embodiments. It is rather the case that the invention includes each new feature and each combination of features included, in particular, each combination of features in the claims even if this feature or this combination is not itself explicitly stated in the claims or the exemplified embodiments.

The invention claimed is:

1. An optoelectronic semiconductor component comprising:
   a semiconductor body having an active zone for generating electromagnetic radiation, an n-contact for electrical contacting purposes and a p-contact for electrical contacting purposes, wherein the semiconductor body is based on $In_xGa_yAl_{1-x-y}P$ or $In_xGa_yAl_{1-x-y}As$, where $0 \leq x, y \leq 1$ and $x+y \leq 1$;
   a mirror;
   a carrier, wherein the semiconductor body is disposed on the carrier;
   a dielectric layer disposed between the semiconductor body and mirror; and
   an additional layer disposed between the semiconductor body and dielectric layer, wherein the additional layer comprises GaP or InGaAlP or InAlP, the aluminum content is selected such that no fundamental absorption occurs at the emission wavelength of the radiation emitted from the active zone and wherein the additional layer has an aperture in a region of the p-contact.

2. The optoelectronic semiconductor component according to claim 1, wherein a band gap of the additional layer is selected such that no fundamental absorption of radiation generated in the active zone occurs, and
   wherein the additional layer is located directly on the dielectric layer and the dielectric layer comprises a silicon nitride, a silicon oxide or a silicon oxynitride and the mirror comprises Ag or Au or an alloy with Ag or Au.

3. The optoelectronic semiconductor component according to claim 2,
   wherein the semiconductor body is disposed on the carrier and a layer of the semiconductor body facing the carrier is a GaAs termination layer.

4. The optoelectronic semiconductor component according to claim 1, wherein the p-contact is formed in a structured manner.

5. The optoelectronic semiconductor component according to claim 1, wherein the additional layer is electrically conductive.

6. The optoelectronic semiconductor component according to claim 1, wherein the p-contact and the mirror are formed as one piece.

7. The optoelectronic semiconductor component according to claim 1, wherein the p-contact and the mirror are formed in two parts and wherein the dielectric layer has an aperture in the region of the p-contact.

8. The optoelectronic semiconductor component according to claim 1, wherein a mirror layer is disposed between the mirror and the dielectric layer, the mirror layer having an aperture in a region of the p-contact.

9. The optoelectronic semiconductor component according to claim 8, wherein the p-contact or the mirror are guided through the apertures in the dielectric layer, the additional layer and the mirror layer.

10. The optoelectronic semiconductor component according to claim 1, wherein the semiconductor body comprises a thin-film LED.

11. The optoelectronic semiconductor component according to claim 1, wherein the additional layer is electrically insulating.

12. A method for producing the optoelectronic semiconductor component of claim 1, the method comprising:
    providing the semiconductor body which has a first contact, the first contact being either the n-contact or the p-contact;
    applying the additional layer to the side of the semiconductor body facing away from the contact;
    forming apertures in the additional layer;
    applying the dielectric layer to the additional layer;
    forming apertures in the dielectric layer in a region of the apertures in the additional layer;
    applying a structured second contact to the semiconductor body in the apertures in the dielectric layer and in the additional layer, wherein the second is the n-contact when the first contact is the p-contact and wherein the second is the p-contact when the first contact is the n-contact; and
    applying the mirror to the dielectric layer and the second contact.

13. The method according to claim 12, wherein the first contact is the n-contact and the second contact is the p-contact.

14. The method according to claim 12, wherein the structured second contact is applied prior to application of the dielectric layer to the semiconductor body in the apertures in the additional layer.

15. The method according to claim 12, wherein the second contact and the mirror are formed as one piece and applied together.

16. The method according to claim 12, wherein the additional layer and the dielectric layer are first applied and then the apertures are formed in the additional layer and the dielectric layer.

17. The method according to claim 12, wherein a mirror layer is applied to the dielectric layer prior to application of the mirror and the second contact and apertures are formed in the mirror layer in the region of the apertures in the additional layer and the dielectric layer.

18. An optoelectronic semiconductor component comprising:
    a semiconductor body having an active zone for generating electromagnetic radiation and an n-contact and a p-contact for electrical contacting purposes, wherein the semiconductor body is based on $In_xGa_yAl_{1-x-y}P$ or $In_xGa_yAl_{1-x-y}As$, in each case with $0 \leq x, y \leq 1$ and $x+y \leq 1$;
    a mirror;

a carrier, wherein the semiconductor body is disposed on the carrier and a layer of the semiconductor body facing the carrier is a GaAs termination layer;

a dielectric layer disposed between the semiconductor body and mirror; and an additional layer disposed between the semiconductor body and dielectric layer, wherein the additional layer comprises GaP or InGaAlP or InAlP, the aluminum content is selected such that no fundamental absorption occurs at the emission wavelength of the radiation emitted from the active zone, wherein the additional layer has an aperture in a region of the p-contact, wherein the additional layer is located between the GaAs termination layer and the dielectric layer, and wherein the GaAs termination layer is not thinned at the aperture in the additional layer.

19. The optoelectronic semiconductor component according to claim 18, wherein the dielectric layer is in direct contact with the semiconductor body in places and completely penetrates through the GaAs termination layer and the additional layer, the places being different from and not in direct contact with the aperture.

\* \* \* \* \*